(12) United States Patent
Ru et al.

(10) Patent No.: US 8,757,716 B2
(45) Date of Patent: Jun. 24, 2014

(54) CONTROL DEVICE FOR A CHILDREN'S BOUNCER AND INFANT SUPPORT

(75) Inventors: Chen Jing Ru, Foshan (CN); David Gilbert, Cumming, GA (US); Zheng Qiao Xing, Ganzhou (CN)

(73) Assignee: Kids II, Inc., Atlanta, GA (US)

( * ) Notice: Subject to any disclaimer, the term of this patent is extended or adjusted under 35 U.S.C. 154(b) by 148 days.

(21) Appl. No.: 13/228,279

(22) Filed: Sep. 8, 2011

(65) Prior Publication Data

US 2012/0062004 A1    Mar. 15, 2012

Related U.S. Application Data (60) Provisional application No. 61/380,841, filed on Sep. 8, 2010, provisional application No. 61/387,706, filed on Sep. 29, 2010.

(51) Int. Cl.
*A47C 1/00* (2006.01)
*A47D 1/00* (2006.01)

(52) U.S. Cl.
USPC .................................. 297/217.3; 297/344.11

(58) Field of Classification Search
USPC .............................. 297/273, 344.11, DIG. 11
See application file for complete search history.

(56) References Cited

U.S. PATENT DOCUMENTS

| | | |
|---|---|---|
| 3,842,450 A | 10/1974 | Pad |
| 3,849,812 A | 11/1974 | Walsh |
| 4,616,824 A | 10/1986 | Quinlan, Jr. et al. |
| 4,730,176 A | 3/1988 | Matsuo et al. |
| 4,893,366 A * | 1/1990 | Rosen .................. 5/109 |
| 4,904,926 A | 2/1990 | Pasichinskyj |
| 4,941,453 A | 7/1990 | Shakas et al. |
| 4,945,269 A | 7/1990 | Kamm |
| 5,048,135 A | 9/1991 | Chen |
| 5,307,531 A | 5/1994 | Kao |
| 5,335,163 A | 8/1994 | Seiersen |
| 5,394,131 A | 2/1995 | Lungu |

(Continued)

FOREIGN PATENT DOCUMENTS

| | | |
|---|---|---|
| CN | 1714708 A | 1/2006 |
| CN | 101365367 A | 2/2009 |

(Continued)

OTHER PUBLICATIONS

International Search Report and Written Opinion from corresponding International Application No. PCT/US2011/050875 mailed Nov. 29, 2011.

(Continued)

*Primary Examiner* — Sarah B McPartlin
(74) *Attorney, Agent, or Firm* — Alston & Bird LLP (57) ABSTRACT

Various embodiments of the present invention are directed to a piezoelectric motion sensing apparatus and a bouncer control device configured to control the oscillation of a children's bouncer based on feedback from the piezoelectric motion sensing apparatus. In various embodiments, the piezoelectric motion sensing apparatus is configured to sense the motion of a body to which it is attached, such as a children's bouncer, and provide a feedback signal indicative of the motion. In addition, various embodiments of the present invention are directed to an infant support control device configured to impart soothing sensation to a child positioned in the infant support. In particular, the infant support control device is configured to impart gentle, repetitive pulses to an infant support that mimic the heartbeat of a parent or caregiver.

17 Claims, 6 Drawing Sheets

(56) References Cited

U.S. PATENT DOCUMENTS

| | | | |
|---|---|---|---|
| 5,574,339 A * | 11/1996 | Kattwinkel et al. ............ 318/10 |
| 5,608,366 A | 3/1997 | Sako | |
| 5,624,155 A | 4/1997 | Bluen et al. | |
| 5,694,030 A | 12/1997 | Sato et al. | |
| 6,068,566 A * | 5/2000 | Kim ................................ 474/84 |
| 6,109,110 A * | 8/2000 | Hwang ........................... 73/654 |
| 6,246,561 B1 | 6/2001 | Flynn | |
| 6,362,718 B1 | 3/2002 | Patrick et al. | |
| 6,378,940 B1 | 4/2002 | Longoria et al. | |
| 6,431,646 B1 | 8/2002 | Longoria | |
| 6,574,806 B1 | 6/2003 | Maher | |
| 6,580,190 B2 | 6/2003 | Takasu | |
| 6,692,368 B1 | 2/2004 | Hyun | |
| 6,710,476 B2 | 3/2004 | Tanozaki et al. | |
| 6,774,589 B2 | 8/2004 | Sato et al. | |
| 6,869,368 B1 | 3/2005 | Clarke et al. | |
| 6,884,226 B2 | 4/2005 | Pereira | |
| 6,908,398 B1 | 6/2005 | Kang | |
| 6,916,249 B2 | 7/2005 | Meade | |
| 7,211,974 B2 | 5/2007 | Takeuchi | |
| 7,551,100 B1 | 6/2009 | Salley et al. | |
| 7,607,734 B2 | 10/2009 | Clapper et al. | |
| 2002/0100116 A1 * | 8/2002 | Richards ........................... 5/108 |
| 2005/0091744 A1 | 5/2005 | Mayyak | |
| 2005/0283908 A1 | 12/2005 | Wong et al. | |
| 2006/0031985 A1 * | 2/2006 | Bloemer et al. .................. 5/105 |
| 2008/0098521 A1 | 5/2008 | Westerkamp et al. | |

FOREIGN PATENT DOCUMENTS

| | | |
|---|---|---|
| DE | 7520683 | 7/1976 |
| EP | 0210816 | 2/1987 |
| JP | 2002-372549 | 12/2002 |
| WO | WO 97/14025 | 4/1997 |
| WO | WO 2007/013770 | 2/2007 |
| WO | WO 2008/025778 | 3/2008 |
| WO | WO 2010/054289 | 5/2010 |

OTHER PUBLICATIONS

International Search Report and Written Opinion for International Application No. PCT/US2009/063688 mailed Feb. 15, 2010.

International Preliminary Examining Authority, International Preliminary Report on Patentability for International Application No. PCT/US2009/063688, dated Oct. 5, 2010, 15 pages, European Patent Office, The Netherlands.

European Patent Office, Communication Pursuant to Rules 161(1) and 162 EPC for Application No. 09752070.4, dated Jun. 21, 2011, 2 pages, The Netherlands.

European Patent Office, Invitation Pursuant to Article 94(3) and Rule 71(1) EPC for Application No. 09752070.4, dated Mar. 22, 2012, 3 pages, The Netherlands.

European Patent Office, Communication Under Rule 71(3) EPC (Intent to Grant) for Application No. 09752070.4, dated Jul. 4, 2012, 31 pages, The Netherlands.

Canadian Intellectual Property Office, Requisition by the Examiner in Accordance with Subsection 30(2) of the Patent Rules for Application No. 2,743,120, dated Nov. 9, 2012, 2 pages, Canada.

United States Patent and Trademark Office, Office Action for U.S. Appl. No. 12/614,703, dated Mar. 1, 2012, 10 pages, USA.

United States Patent and Trademark Office, Notice of Allowance and Fee(s) Due for U.S. Appl. No. 12/614,703, dated Jul. 11, 2012, 7 pages, USA.

United States Patent and Trademark Office, Notice of Allowance and Fee(s) due for U.S. Appl. No. 12/614,703, dated Oct. 16, 2012, 7 pages, USA.

State Intellectual Property Office of People's Republic of China, First Office Action and Search Report for Application No. 200980147038.9, dated Apr. 3, 2013, 9 pages, China.

United States Patent and Trademark Office, Office Action for U.S. Appl. No. 13/751,999, Mar. 14, 2013, 10 pages, USA.

* cited by examiner

CONTROL DEVICE FOR A CHILDREN'S BOUNCER AND INFANT SUPPORT

CROSS-REFERENCE TO RELATED APPLICATIONS

This application claims priority from provisional U.S. Application No. 61/380,841 entitled "Control System for an Infant Bouncer," which was filed on Sep. 8, 2010, and from provisional U.S. Application No. 61/387,706 entitled "Heartbeat Simulator for an Infant Bouncer," which was filed on Sep. 29, 2010, both of which are herein incorporated by reference.

BACKGROUND OF THE INVENTION

Children's bouncers are used to provide a seat for a child that entertains or soothes the child by oscillating upward and downward in a way that mimics a parent or caretaker holding the infant in their arms and bouncing the infant gently. A typical children's bouncer includes a seat portion that is suspended above a support surface (e.g., a floor) by a support frame. The support frame typically includes a base portion configured to rest on the support surface and semi-rigid support arms that extend above the base frame to support the seat portion above the support surface. In these embodiments, an excitation force applied to the seat portion of the children's bouncer frame will cause the bouncer to vertically oscillate at the natural frequency of the bouncer. For example, a parent may provide an excitation force by pushing down on the seat portion of the bouncer, deflecting the support frame, and releasing the seat portion. In this example, the seat portion will bounce at its natural frequency with steadily decreasing amplitude until the bouncer comes to rest. Similarly, the child may provide an excitation force by moving while in the seat portion of the bouncer (e.g., by kicking its feet).

A drawback of the typical bouncer design is that the bouncer will not bounce unless an excitation force is repeatedly provided by a parent or the child. In addition, as the support arms of typical bouncers must be sufficiently rigid to support the seat portion and child, the amplitude of the oscillating motion caused by an excitation force will decrease to zero relatively quickly. As a result, the parent or child must frequently provide an excitation force in order to maintain the motion of the bouncer. Alternative bouncer designs have attempted to overcome this drawback by using various motors to oscillate a children's seat upward and downward. For example, in one design, a DC motor and mechanical linkage is used to raise a child's seat up and down. In another design, a unit containing a DC motor powering an eccentric mass spinning about a shaft is affixed to a bouncer. The spinning eccentric mass creates a centrifugal force that causes the bouncer to bounce at a frequency soothing to the child.

These designs, however, often generate an undesirable amount of noise, have mechanical components prone to wear and failure, and use power inefficiently. Thus, there remains a need in the art for a children's bouncer that will bounce repeatedly and is self-driven, quiet, durable, and power efficient. Furthermore, there is a need for an improved motion sensing apparatus that can be adapted for use with such bouncers in order to accurately and reliably sense the frequency of a bouncer's oscillation and actively provide feedback indicative of the sensed frequency to a control system configured to drive the motion of the bouncer based, at least in part, on the sensing apparatus' feedback.

In addition, existing bouncer designs are generally limited to providing a bouncing motion that is distinct from certain motions infants experience in a pre-natal state, or in a post-natal state, such as when being nursed or otherwise held closely by a parent or caregiver. As a result, the sensation resulting from the motion provided by exiting bouncer designs may not be soothing to all infants. Accordingly, there is a need in the art for an infant support configured to provide a soothing sensation to a child positioned within the infant support that differs from the typical bouncing motion provided by existing bouncer designs.

BRIEF SUMMARY OF THE INVENTION

Various embodiments of the present invention are directed to a motion sensing apparatus for a moving child support device. According to various embodiments, the motion sensing apparatus comprises a housing defining a longitudinal axis, at least one piezoelectric sensor having a sensing surface positioned within the housing, and a weighted member positioned within the housing and configured for movement within the housing in the direction of the housing's longitudinal axis. The weighted member is configured to apply a variable force to the sensing surface of the piezoelectric sensor in response to movement of the motion sensing apparatus, while the piezoelectric sensor is configured to output a voltage signal corresponding to the magnitude of the variable force applied by the weighted member. The resulting output voltage signal is indicative of the motion sensing apparatus's movement with respect to the housing's longitudinal axis.

Various other embodiments of the present invention are directed to a bouncer control device for controlling the generally upward and downward motion of a children's bouncer. According to various embodiments, the bouncer control device comprises a drive assembly configured to be actuated by electric current in order to impart a motive force on the children's bouncer that causes the children's bouncer to bounce, a power supply configured to transmit electric current to the drive assembly, a piezoelectric motion sensor configured to sense the natural frequency of the children's bouncer and generate a frequency signal representative of the natural frequency; and a bouncer control circuit configured to receive the frequency signal from the piezoelectric motion sensor; and to generate a control signal, based at least in part on the received frequency signal, that causes the power supply to intermittently supply electric current to the drive assembly and thereby causes the drive assembly to impart a motive force on the children's bouncer that causes the bouncer to bounce at a frequency substantially equal to the natural frequency.

Various other embodiments of the present invention are directed to a control device for an infant support configured for providing a soothing sensation for a child position in the infant support. According to various embodiments, the control device comprises a drive assembly configured to impart repetitive pulse forces to the infant support with a magnitude sufficient for the pulses to be felt by a child positioned in the infant support, and a control circuit configured to actuate the drive assembly and cause the drive assembly to impart the repetitive pulse forces on the infant support at a frequency analogous to the frequency of a resting human heartbeat.

BRIEF DESCRIPTION OF THE DRAWINGS

Reference will now be made to the accompanying drawings, which are not necessarily drawn to scale, and wherein.

DETAILED DESCRIPTION OF THE INVENTION

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
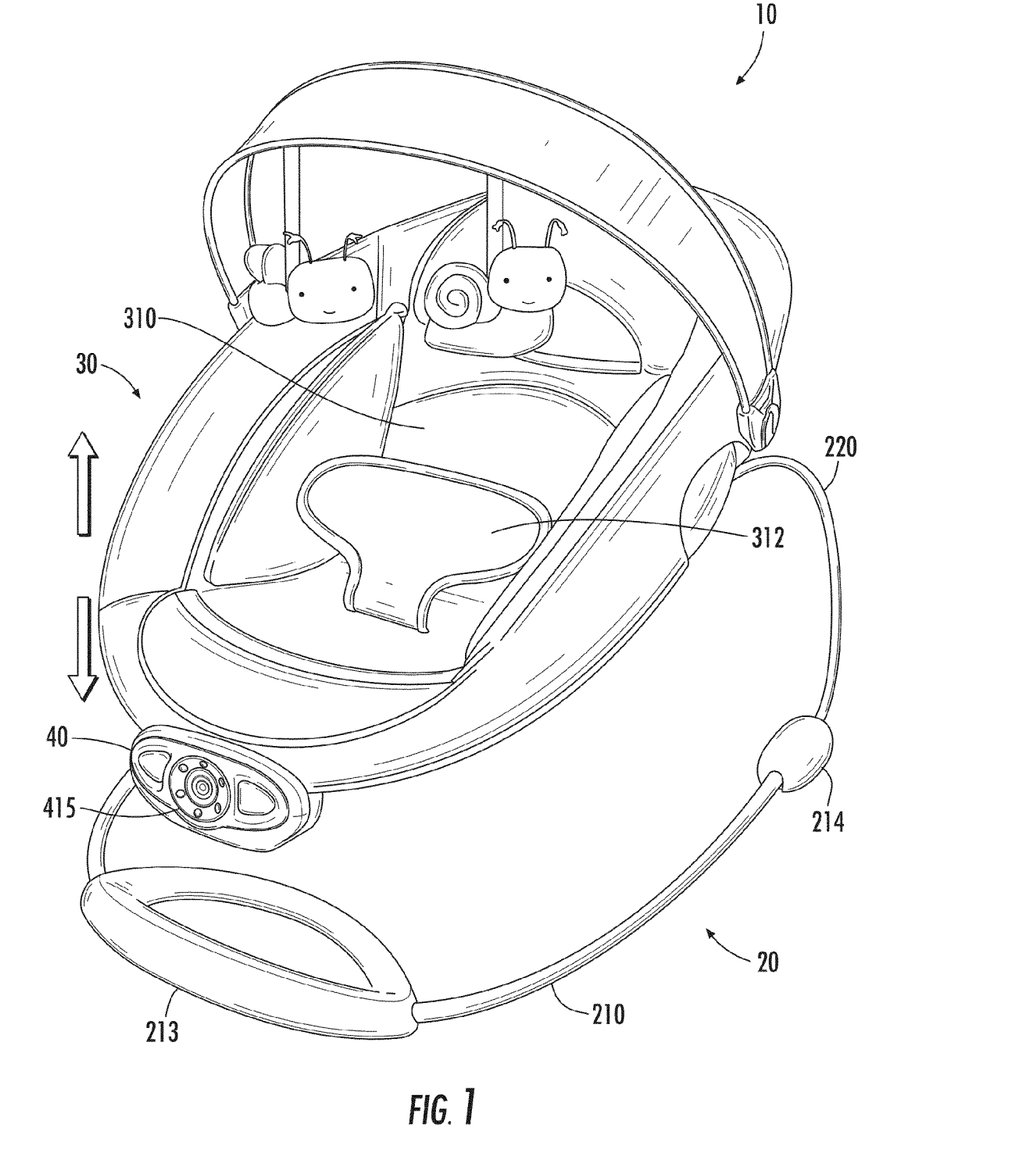
FIG. 1 shows a perspective view of a children's bouncer according to one embodiment of the present invention.

As shown in FIG. 1, various embodiments of the present invention are directed to a children's bouncer apparatus 10 for providing a controllable bouncing seat for a child. The apparatus 10 includes a support frame 20, seat assembly 30, and bouncer control device 40.

Support Frame & Seat Assembly

According to various embodiments, the support frame 20 is a resilient member forming a base portion 210 and one or more support arms 220. In the illustrated embodiment, one or more flat non-skid members 213, 214 are affixed to the base portion 210 of the support frame 20. The flat non-skid members 213, 214 are configured to rest on a support surface and provide a stable platform for the base portion 210. The one or more support arms 220 are arcuately shaped and extend upwardly from the base portion 210. The support arms 220 are configured to support the seat assembly 30 by suspending the seat assembly 30 above the base portion 210. The support arms 220 are semi-rigid and configured to resiliently deflect under loading. Accordingly, the seat assembly 30 will oscillate substantially vertically in response to an exciting force, as shown by the motion arrows in FIG. 1.

In the illustrated embodiment, the seat assembly 30 includes a padded seat portion 310 configured to comfortably support a child. The seat portion 310 further includes a harness 312 configured to be selectively-attached to the seat portion 310 in order to secure a child in the seat portion 310. The seat assembly 30 further includes a control device receiving portion (not shown) configured to receive and selectively secure the bouncer control device 40 to the seat assembly 30. In other embodiments, the bouncer control device 40 is permanently secured to the seat assembly 30.

Bouncer Control Device

Figure 2:
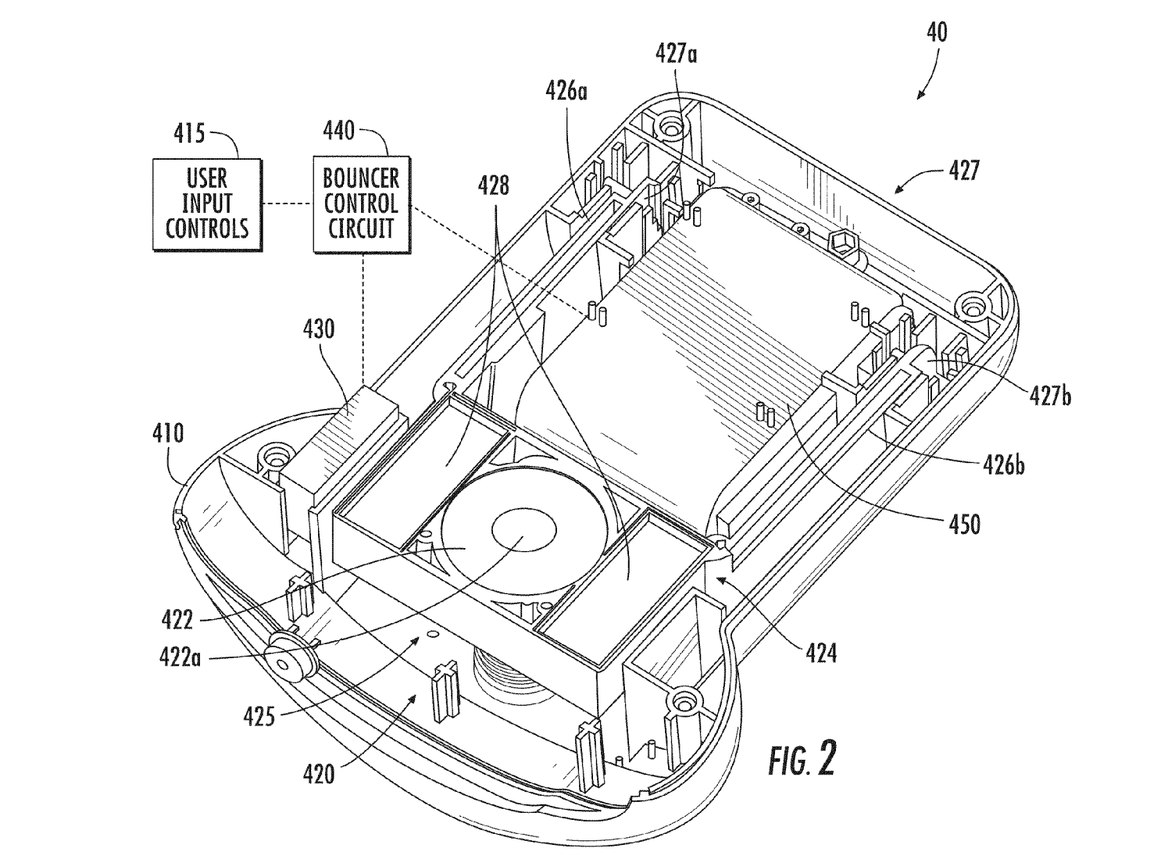
FIG. 2 shows a perspective view of the interior of a bouncer control device according to one embodiment of the present invention.

As shown in FIG. 2, according to various embodiments, the bouncer control device 40 is comprised of a housing 410, user input controls 415, magnetic drive assembly 420, bouncer motion sensor 430, and bouncer control circuit 440. In the illustrated embodiment, the bouncer control device 40 further includes a power supply 450. In other embodiments, the bouncer control device 40 is configured to receive power from an externally located power supply. The housing 410 is comprised of a plurality of walls defining a cavity configured to house the magnetic drive assembly 420, bouncer motion sensor 430, bouncer control circuit 440, and power supply 450. As described above, the housing 410 is configured to be selectively attached to the seat assembly 30. User input controls 415 (shown in more detail in FIG. 1) are affixed to a front wall of the housing 410 and are configured to allow a user to control various aspects of the children's bouncer apparatus (e.g., motion and sound). In the illustrated embodiment, the user input controls 415 include a momentary switch configured to control the amplitude of the seat assembly's 30 oscillatory movement. In FIG. 2, the bouncer control device 40 is shown with the user input controls 415 and an upper portion of the housing 410 removed.

According to various embodiments, the magnetic drive assembly 420 includes a first magnetic component, second magnetic component, and a drive component. The drive component is configured to impart a motive force to the seat assembly 30 in response to a magnetic force between the first magnetic component and second magnetic component. At least one of the first magnetic component and second magnetic component is an electromagnet (e.g., an electromagnetic coil) configured to generate a magnetic force when supplied with electric current. For example, according to embodiments in which the second magnetic component is an electromagnet, the first magnetic component may be any magnet (e.g., a permanent magnet or electromagnet) or magnetic material (e.g., iron) that responds to a magnetic force generated by the second magnetic component. Similarly, according to embodiments in which the first magnetic component is an electromagnet, the second magnetic component may be any magnet or magnetic material that responds to a magnetic force generated by the first magnetic component.

Figure 3:
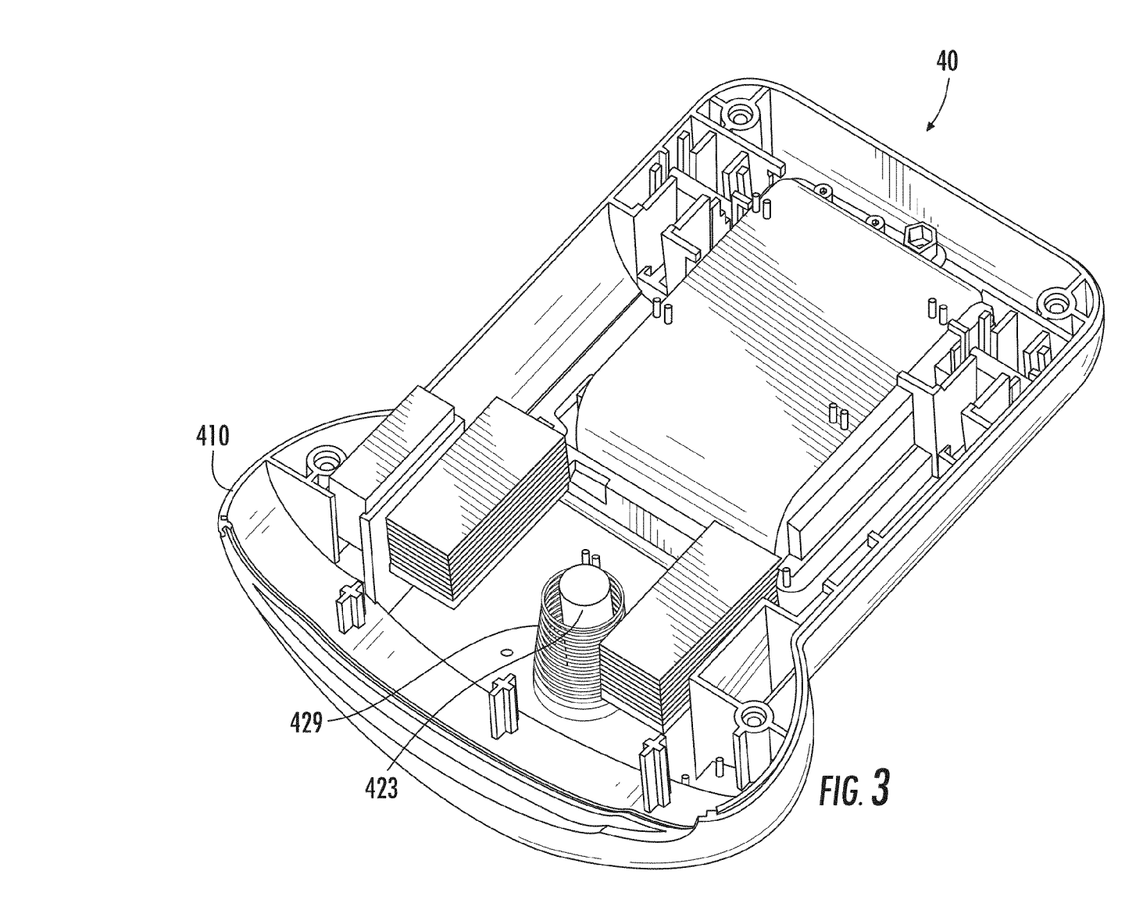
FIG. 3 shows another perspective view of the interior of a bouncer control device according to one embodiment of the present invention.

FIG. 3 shows the interior of the bouncer control device 40 of FIG. 2 with the mobile member 424 and electromagnetic coil 422 removed. In the illustrated embodiment of FIGS. 2 and 3, the first magnetic component comprises a permanent magnet 421 (shown in FIG. 4) formed by three smaller permanent magnets stacked lengthwise within an magnet housing 423. The second magnetic component comprises an electromagnetic coil 422 configured to receive electric current from the power supply 450. The drive component comprises a mobile member 424 and a reciprocating device. The mobile member 424 is a rigid member having a free end 425 and two arms 426a, 426b that extend to a pivoting end 427. The arms 426a, 426b are pivotally connected to an interior portion of the housing 410 at pivot points 427a and 427b respectively. The free end 425 of the mobile member 424 securely supports the electromagnetic coil 422 and can support two weights 428 positioned symmetrically adjacent to the electromagnetic coil 422. As will be described in more detail below, the mobile member 424 is configured to rotate about its pivot points 427a, 427b in response to a magnetic force generated between the permanent magnet 421 and electromagnetic coil 422.

According to various embodiments, the reciprocating device is configured to provide a force that drives the mobile member 424 in a direction substantially opposite to the direction the magnetic force generated by the permanent magnet 421 and electromagnetic coil 422 drives the mobile member 424. In the illustrated embodiment of FIGS. 2 and 3, the reciprocating device is a spring 429 positioned below the free end 425 of the mobile member 424 and substantially concentric with the electromagnetic coil 422. The magnet housing 423 is arcuately shaped, has a substantially circular cross-section, and is positioned substantially within the spring 429. In addition, the magnet housing 423 is shaped such that it fits within a cavity 422a of the electromagnetic coil 422. As is described in more detail below, the magnet housing 423 is positioned such that its cross section is concentric to the electromagnetic coil 422 at all points along the electromagnetic coil's 422 range of motion. In other embodiments, the magnet housing 423 is substantially vertical in shape.

According to various embodiments, the bouncer motion sensor 430 is a sensor configured to sense the frequency at which the seat assembly 30 is vertically oscillating at any given point in time and generate a frequency signal representative of that frequency. According to one embodiment, the bouncer motion sensor 430 comprises a movable component recognized by an optical sensor (e.g., a light interrupter). According to another embodiment, the bouncer motion sensor 430 comprises an accelerometer. As will be appreciated by one of skill in the art, according to various embodiments, the bouncer motion sensor 430 may be any sensor capable of sensing the oscillatory movement of the seat assembly 30 including a Hall effect sensor.

Figure 5:
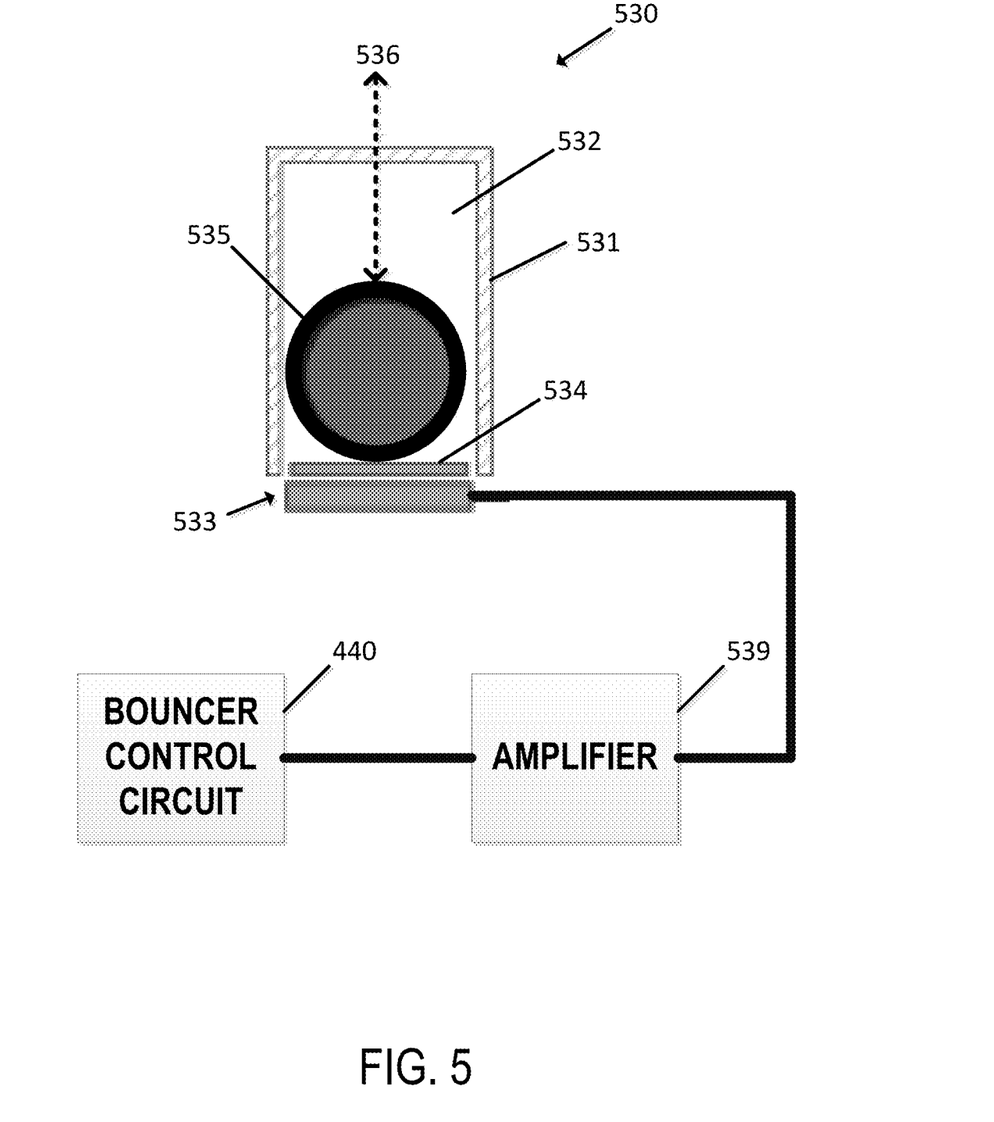
FIG. 5 shows a schematic diagram of a motion sensing apparatus, amplifier, and bouncer control circuit according to one embodiment of the present invention.

In one embodiment, the bouncer motion sensor 430 comprises a piezoelectric motion sensor. FIG. 5 provides a schematic diagram of a piezoelectric motion sensor 530 according to one embodiment. In the illustrated embodiment, the piezoelectric motion sensor 530 comprises a housing 531, a piezoelectric sensor 533, and a weighted member in the form of a weighted ball 535. The housing 531 is a generally hollow cylinder and defines an elongated interior channel 532 having a central longitudinal axis 536. According to various embodiments, the housing 531 and channel 532 are oriented generally vertically with respect to the bouncer control device 40. The weighted ball 535 is positioned within the channel 532 and is configured to move within the channel 532. As shown in FIG. 5, the channel 532 is dimensioned such that the weighted ball's movement is substantially constrained to movement in the direction of the channel's longitudinal axis 536.

The motion sensor 530 also includes a piezoelectric sensor 533 positioned within the housing 531 at the lower end of the channel 532. In particular, the piezoelectric sensor 533 includes a sensing surface 534 and is oriented such that the sensing surface 534 is generally perpendicular to the channel's longitudinal axis 536. In addition, according to various embodiments, the motion sensor 530 is secured within the housing 410 of the bouncer control device 40 such that, when the seat assembly 30 is at rest, the sensing surface 534 is generally parallel to the support surface on which the bouncer's support frame 20 rests.

According to various embodiments, the piezoelectric sensor 533 is configured to generate a voltage signal corresponding to the magnitude of compressive force applied to the sensor's sensing surface 534. When the seat assembly 30 is at rest, the weighted ball 535 will remain at rest with its weight applying a constant resting force to the sensing surface 534. As such, the piezoelectric sensor 533 will output a constant voltage when the seat assembly 30 is at rest. However, when seat assembly 30 oscillates vertically, the motion sensor 530 moves with the seat assembly 30 and causes the weighted ball 535 to exert varying magnitudes of compressive force on the sensing surface 534 as the seat assembly 30 accelerates and decelerates, upwardly and downwardly.

For example, when the seat assembly 30 is at its lowest position and begins accelerating upward, the weighted ball 535 experiences g-forces in excess of 1 g as gravitational forces push it against the sensing surface 534. As a result, the weighted ball 535 applies a compressive force greater than the resting compressive force. As the seat assembly 30 continues upward and passes its resting position, the seat assembly 30 begins decelerating. As a result, the weighted ball 535 experiences g-forces of less than 1 g and the compressive force applied by the weighted ball 535 decreases to a magnitude less than the resting compressive force. When the seat assembly 30 reaches its highest position and begins accelerating downwardly in the opposite direction, the weighted ball 535 continues to experience g-forces of less than 1 g and applies a compressive force that is less than the resting compressive force. Indeed, in certain embodiments, the weighted ball 535 may lift off of the sensing surface 534 and apply no compressive force for a certain period during the seat assembly's upward deceleration or downward acceleration. As the seat assembly 30 continues downward and again passes its resting position, the seat assembly 30 begins decelerating. As a result, the weighted ball 535 again experiences g-forces in excess of 1 g and applies a compressive force to the sensing surface 534 that is greater than the resting compressive force. When the seat assembly 30 reaches its lowest position, the oscillation cycle begins again.

As a result of the varying compressive forces applied by the weighted ball 535 to the sensing surface 534, the piezoelectric sensor 533 generates a voltage signal that varies in accordance with the motion of the seat assembly 30. Thus, the signal generated by the piezoelectric motion sensor 530 is generally representative of the movement of the motion sensor 530 and indicative of the frequency of the motion sensor's oscillation with respect to the longitudinal axis 536. As explained in greater detail below, the piezoelectric motion sensor 530 may be configured such that its output signal is filtered by an amplifier 539 and transmitted to the bouncer control circuit 440 for use in controlling the operation of the bouncer control device 40.

As will be appreciated from the description herein, various aspects of the piezoelectric motion sensor 530 may be modified according to various other embodiments of the sensor. For example, in certain embodiments the weighted ball 535 may be constrained within the channel 532 such that it is always in contact with the sensing surface 534 of the piezoelectric sensor 533, but is permitted to apply compressive forces of different magnitudes as the motion sensor 530 moves. In other embodiments, a weighted member may be affixed to the sensing surface 534 and configured to apply compressive and/or expansive forces in response to the motion of the sensor 530. In addition, according to various embodiments, the housing 531 and channel 532 may be may be cylindrical, rectangular, or other suitable shapes, and the weighted member may be any mobile object of sufficient mass to be sensed by the piezoelectric sensor 533.

The bouncer control circuit 440 can be an integrated circuit configured to control the magnetic drive assembly 420 by triggering the power supply 450 to transmit electric current pulses to the electromagnetic coil 422 according to a control algorithm (described in more detail below). In the illustrated embodiment, the power supply 450 is comprised of one or more batteries (not shown) and is configured to provide electric current to the electromagnetic coil 422 in accordance with a control signal generated by the bouncer control circuit 440. According to certain embodiments, the one or more batteries may be disposable (e.g., AAA or C sized batteries) or rechargeable (e.g., nickel cadmium or lithium ion batteries). In various other embodiments, the power supply 450 is comprised of a linear ΔC/DC power supply or other power supply using an external power source.

Figure 4:
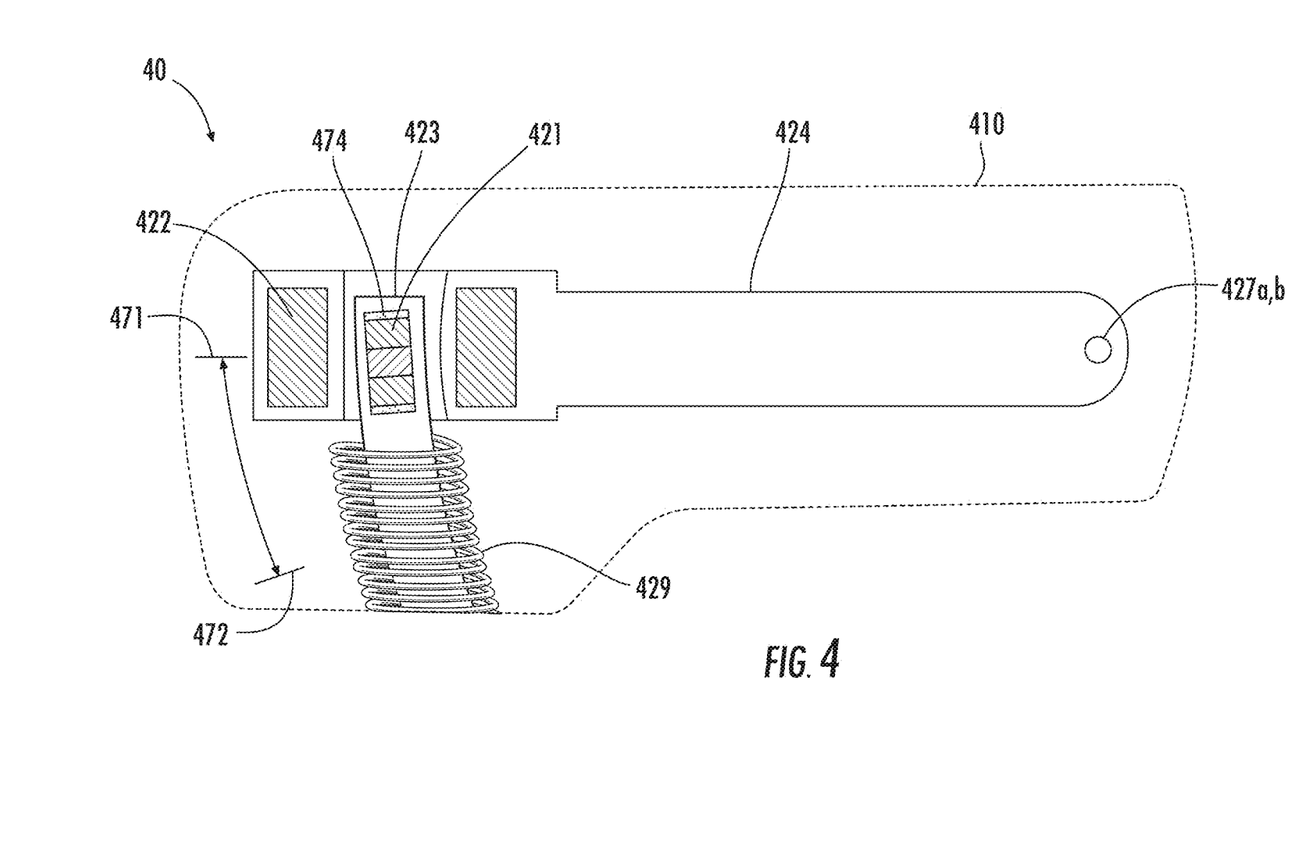
FIG. 4 shows a schematic sectional view of the interior of a bouncer control device according to one embodiment of the present invention.

FIG. 4 shows a schematic sectional view of one embodiment of the bouncer control device 40. In the illustrated embodiment, the permanent magnet 421 is formed from three individual permanent magnets positioned within the magnet housing 423, although fewer or more individual magnets could be used. Damping pads 474 are positioned at the top and bottom ends of the permanent magnet 421 to hold the permanent magnet 421 securely in place and prevent it from moving within the magnet housing 423 in response to a magnetic force from the electromagnetic coil 422, which might create noise. According to certain embodiments, damping material (not shown) may also be positioned within the housing 410 above the free end 425 of the mobile member 424 to prevent the mobile member 424 from striking the housing 410.

In the illustrated embodiment, the spring 429 extends upwardly from the housing 410 to the bottom edge of the free end of the mobile member 424. As described above, the magnet housing 423 is positioned within the spring 429 and extends upwardly through a portion of the cavity 422a (shown in FIG. 2) of the electromagnetic coil 422. As shown in FIG. 4, the mobile member 424 is free to rotate about pivot points 427a and 427b between an upper position 471 and a lower position 472. As the mobile member 424 rotates between the upper position 471 and lower position 472, the electromagnetic coil 422 follows an arcuate path defined by the length of the mobile member 424. Accordingly, the magnet housing 423 is curved such that, as the mobile member 424 rotates between its upper position 471 and lower position 472, the electromagnetic coil 422 will not contact the magnet housing 423. According to other embodiments, the magnet housing 423 is substantially vertically shaped and dimensioned such that it does not obstruct the path of the mobile member 424.

According to various embodiments, the bouncer control circuit 440 is configured to control the electric current transmitted to the electromagnetic coil 422 by the power supply 450. In the illustrated embodiment, the power supply 450 transmits electric current in a direction that causes the electromagnetic coil 422 to generate a magnetic force that repels the electromagnetic coil 422 away from the permanent magnet 421. When the electromagnetic coil 422 is not supplied with electric current, there is no magnetic force generated between the permanent magnet 421 and electromagnetic coil 422. As a result, as shown in FIG. 4, the mobile member 424 rests at its upper position 471. However, when a magnetic force is generated by supplying electric current to the electromagnetic coil 422, the magnetic force pushes the electromagnetic coil 422 downward and causes the mobile member 424 to rotate toward its lower position 472. This occurs because the permanent magnet 421 is fixed within the stationary magnet housing 423, while the electromagnetic coil 422 is affixed to the mobile member 424. According to other embodiments, the power supply 450 transmits electric current in a direction that causes the electromagnetic coil 422 to generate a magnetic force that attracts the electromagnetic coil 422 toward the permanent magnet 421.

When provided with current having sufficient amperage, the magnetic force generated by the electromagnetic coil 422 will cause the mobile member 424 to compress the spring 429 and, as long as current is supplied to the electromagnetic coil 422, will cause the mobile member 424 to remain in its lower position 472. However, when the power supply 450 stops transmitting electric current to the electromagnetic coil 422, the electromagnetic coil 422 will stop generating the magnetic force holding the mobile member 424 in its lower position 472. As a result, the spring 429 will decompress and push the mobile member 424 upward, thereby rotating it to its upper position 471. Similarly, if a sufficiently strong pulse of electric current is transmitted to the electromagnetic coil 422, the resulting magnetic force will cause the mobile member 424 to travel downward, compressing the spring 429. The angular distance the mobile member 424 rotates and the angular velocity with which it rotates that distance is dependent on the duration and magnitude of the pulse of electric current. When the magnetic force generated by the pulse dissipates, the spring 429 will decompress and push the mobile member 424 back to its upper position 471.

In accordance with the dynamic properties described above, the mobile member 424 will vertically oscillate between its upper position 471 and lower position 472 in response to a series of electric pulses transmitted to the electromagnetic coil 422. In the illustrated embodiment, the frequency and amplitude of the mobile member's 424 oscillatory movement is dictated by the frequency and duration of electric current pulses sent to the electromagnetic coil 422. For example, electrical pulses of long duration will cause the mobile member 424 to oscillate with high amplitude (e.g., rotating downward to its extreme point, the lower position 472), while electrical pulses of short duration will cause the mobile member 424 to oscillate with low amplitude (e.g., rotating downward to a non-extreme point above the lower position 472). Similarly, electrical pulses transmitted at a high frequency will cause the mobile member 424 to oscillate at a high frequency, while electrical pulses transmitted at a low frequency will cause the mobile member 424 to oscillate at a low frequency. As will be described in more detail below, the mobile member's 424 oscillation is controlled in response to the frequency of the support frame 20 and seat assembly 30 as identified by the bouncer motion sensor 430.

According to various embodiments, the bouncer control device 40 is configured to impart a motive force on the seat assembly 30 by causing the mobile member 424 to oscillate within the housing 410. As the bouncer control device 40 is affixed to the seat assembly 30, the momentum generated by the oscillatory movement of the mobile member 424 causes the seat assembly 30 to oscillate along its own substantially vertical path, shown by arrows in FIG. 1. This effect is enhanced by the weights 428 secured to the free end 425 of the mobile member 424, which serve to increase the momentum generated by the movement of the mobile member 424. As will be described in more detail below, by oscillating the mobile member 424 at a controlled frequency and amplitude, the bouncer control device 40 causes the seat assembly 30 to oscillate at a desired frequency and amplitude.

Bouncer Control Circuit

According to various embodiments, the bouncer control circuit 440 comprises an integrated circuit configured to receive signals from one or more user input controls 415 and the bouncer motion sensor 430, and generate control signals to control the motion of the seat assembly 30. In the illustrated embodiment, the control signals generated by the bouncer control circuit 440 control the transmission of electric current from the power supply 450 to the electromagnetic coil 422, thereby controlling the oscillatory motion of the mobile member 424. As described above, high power efficiency is achieved by driving the seat assembly 30 at the natural frequency of the children's bouncer apparatus 10. However, the natural frequency of the children's bouncer apparatus 10 changes depending on, at least, the weight and position of a child in the seat assembly 30. For example, if a relatively heavy child is seated in the seat assembly 30, the children's bouncer apparatus 10 will exhibit a low natural frequency. However, if a relatively light child (e.g., a new-born baby) is seated in the seat assembly 30, the children's bouncer apparatus will exhibit a high natural frequency. Accordingly, the bouncer control circuit 440 is configured to detect the natural frequency of the children's bouncer 10 and cause the mobile member 424 to drive the seat assembly 30 at the detected natural frequency.

According to various embodiments, the bouncer control circuit 440 first receives a signal from one or more of the user input controls 415 indicating a desired amplitude of oscillation for the seat assembly 30. In the illustrated embodiment, the user may select from two amplitude settings (e.g., low and high) via a momentary switch included in the user input controls 415. In another embodiment, the user may select from two or more preset amplitude settings (e.g., low, medium, high) via a dial or other control device included in the user input controls 415. Using an amplitude look-up table and the desired amplitude received via the user input controls 415, the bouncer control circuit 440 determines an appropriate duration D-amp for the electrical pulses that will be sent to the electromagnetic coil 422 to drive the seat assembly 30 at the natural frequency of the children's bouncer apparatus 10. The determined value D-amp is then stored by the bouncer control circuit 440 for use after the bouncer control circuit 440 determines the natural frequency of the bouncer.

Figure 6A:
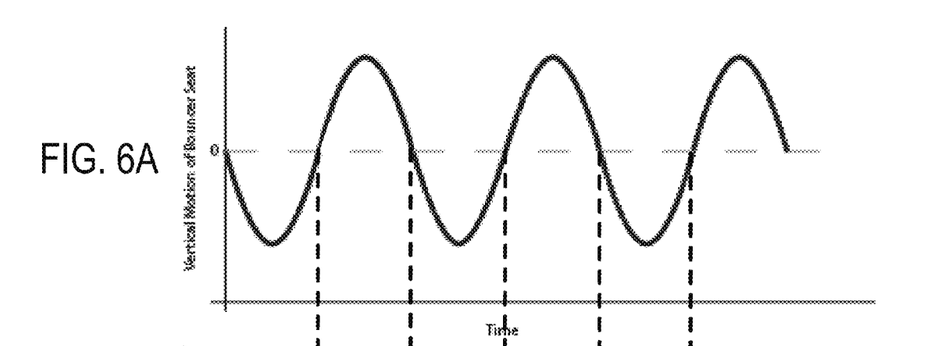
FIG. 6A shows a graph indicating the motion of a bouncer seat over a certain period of time according to one embodiment of the present invention.

According to the illustrated embodiment, to determine the natural frequency of the bouncer, the bouncer control circuit 440 executes a programmed start-up sequence. The start-up sequence begins with the bouncer control circuit 440 generating an initial control signal causing the power supply 450 to transmit an initial electrical pulse of duration D1 to the electromagnetic coil 422, thereby causing the mobile member 424 to rotate downward and excite the seat assembly 30. For example, FIG. 6C shows a graph indicating an initial pulse transmitted to the electromagnetic coil 422 and FIG. 6A shows a graph indicating the responsive movement of the seat assembly 30. The magnetic force generated by the electromagnetic coil 422 in response to the initial pulse causes the mobile member 424 to stay in a substantially downward position for a time period substantially equal to D1. As described above, while a continuous supply of electric current is supplied to the electromagnetic coil 422, the mobile member 424 is held stationary at or near its lower position 472 and does not drive the seat assembly 30. Accordingly, during the time period D1, the seat assembly 30 oscillates at its natural frequency.

While the mobile member 424 is held stationary and the seat assembly 30 oscillates at its natural frequency, the bouncer control circuit 440 receives one or more signals from the bouncer motion sensor 430 indicating the frequency of the seat assembly's 30 oscillatory motion and, from those signals, determines the natural frequency of the bouncer apparatus 10. For example, in one embodiment, the bouncer motion sensor 430 sends a signal to the bouncer control device 440 every time the bouncer motion sensor 430 detects that the seat assembly 30 has completed one period of oscillation. The bouncer control circuit 440 then calculates the elapsed time between signals received from the bouncer motion sensor 430 to determine the natural frequency of the bouncer apparatus 10.

In certain embodiments in which the bouncer motion sensor 430 comprises the above-described piezoelectric motion sensor 530, the frequency-indicative voltage signal output by the piezoelectric motion sensor 530 is transmitted to an amplifier 539. As described above, the piezoelectric motion sensor 530 outputs a variable voltage corresponding to the oscillation of the seat assembly 30. According to various embodiments, the amplifier 539 is configured to filter the motion sensor's variable voltage signal and output one of three signals indicative of the seat assembly's movement.

For example, in one embodiment, the amplifier 539 is configured to filter portions of the sensor's voltage signal corresponding to a first voltage range (e.g., a voltage range generally produced by resting compressive forces on the piezo sensing surface 534 when the seat assembly 30 is at rest) and output a first voltage (e.g., 2V) for the first filtered range. In addition, the amplifier 539 is configured to filter portions of the sensor's voltage signal corresponding to a second voltage range (e.g., a voltage range generally produced by high compressive forces on the piezo sensing surface 534 when the seat assembly 30 is accelerating upwardly or decelerating downwardly) and output a second voltage (e.g., 3V) for the second filtered range. Further, the amplifier 539 is configured to filter portions of the sensor's voltage signal corresponding to a third voltage range (e.g., a voltage range generally produced by low compressive forces on the piezo sensing surface 534 when the seat assembly 30 is decelerating upwardly or accelerating downwardly) and output a third voltage (e.g., 1V) for the third filtered range. As a result, the amplifier 539 generates a filtered signal having a first voltage when the seat assembly 30 is at rest, a second voltage when the seat assembly 30 is accelerating upwardly or decelerating downwardly, and a third voltage when the seat assembly 30 is decelerating upwardly or accelerating downwardly.

Figure 6B:
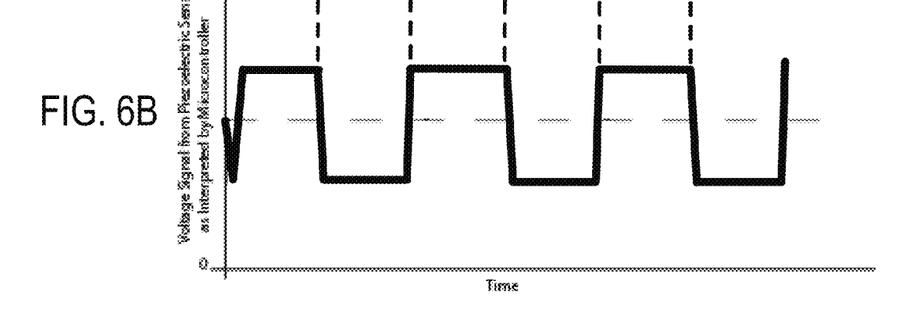
FIG. 6B shows a graph indicating a frequency indicative signal generated by a motion sensing apparatus and an amplifier in response to the motion indicated in FIG. 6A according to one embodiment of the present invention.
Figure 6C:
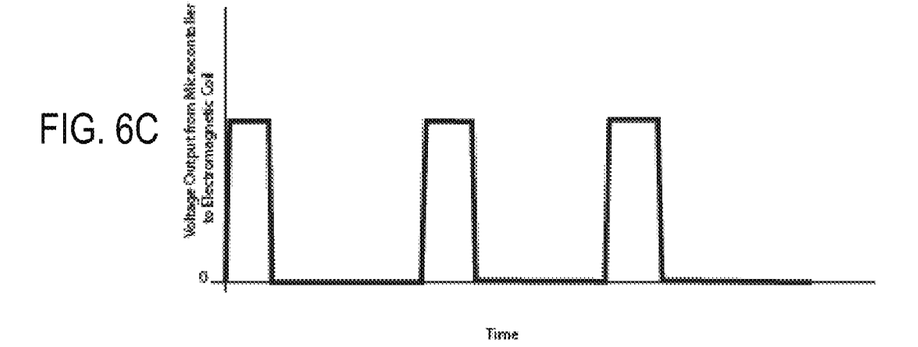
FIG. 6C shows a graph indicating electrical pulses triggered by a bouncer control circuit to drive a children's bouncer in response to receiving the frequency indicative signal shown in FIG. 6B according to one embodiment of the present invention.

As shown in FIGS. 6A and 6B, when the seat assembly 30 is oscillating vertically, changes in the voltage of the filtered signal output by the amplifier 539 (shown in FIG. 6B) correspond to half-cycles of the seat assembly's oscillation. Accordingly, in certain embodiments, the bouncer control circuit 440 is configured to identify the time elapsed between changes in the filtered signal's voltage and determine the frequency of the seat assembly's oscillation over the course of the time period D1. In other embodiments, the bouncer control circuit 440 may be configured to analyze the signal output by the piezoelectric motion sensor 530 directly without the use of an amplifier 539.

If, over the course of the time period D1, the bouncer control circuit 440 does not receive one or more signals from the bouncer motion sensor 430 that are sufficient to determine the natural frequency of the bouncer apparatus 10, the bouncer control circuit 440 causes the power supply 450 to send a second initial pulse to the electromagnetic coil 422 in order to further excite the bouncer apparatus 10. In one embodiment, the second initial pulse may be of a duration D2, where D2 is a time period retrieved from a look-up table and is slightly less than D1. The bouncer control circuit 440 is configured to repeat this start-up sequence until it determines the natural frequency of the bouncer apparatus 10.

After completing the start-up sequence to determine the natural frequency of the children's bouncer apparatus 10, the bouncer control circuit 440 will generate continuous control signals causing the power supply 450 to transmit pulses of electric current having a duration D-amp at a frequency equal to the natural frequency of the children's bouncer apparatus 10. By detecting the oscillatory motion of the seat assembly 30 via the bouncer motion sensor 430, the bouncer control circuit 440 is able to synchronize the motion of the mobile member 424 to the motion of the seat assembly 30, thereby driving the seat assembly's motion in a power efficient manner. The bouncer control circuit 440 will thereafter cause the bouncer apparatus 10 to bounce continuously at a frequency which is substantially that of the natural frequency of the children's bouncer apparatus 10. For example, as shown in FIGS. 6A-6C, the bouncer control circuit 440 can be configured to time pulses transmitted to the electromagnetic coil 422 (FIG. 6C) based on the filtered frequency signal received from the amplifier 539 (FIG. 6B), and in accordance with the position of the seat assembly 30 (FIG. 6A), in order to maintain the seat assembly's frequency of oscillation. As shown in illustrated embodiment of FIG. 6C, when the seat assembly 30 moves toward its lowest position, the bouncer control circuit 440 is configured to trigger a pulse to the electromagnetic coil 422 that rotates the mobile member 424 downward, compresses the spring 429, and drives the seat assembly 30 downward. The pulse triggered by the bouncer control circuit 440 has a duration that expires as the seat assembly 30 is moving upwards, thereby causing the mobile member 424 to move upward as the spring 429 decompresses and drive the seat assembly 30 upward.

According to various embodiments, as the bouncer control circuit 440 is causing the seat assembly 30 to oscillate at the determined natural frequency, the bouncer control circuit 440 continues to monitor the frequency of the of seat assembly's 30 motion. If the bouncer control circuit 440 detects that the frequency of the seat assembly's 30 motion has changed beyond a certain tolerance, the bouncer control circuit 440 restarts the start-up sequence described above and again determines the natural frequency of the bouncer apparatus 10. By doing so, the bouncer control circuit 440 is able to adapt to changes in the natural frequency of the bouncer apparatus 10 caused by the position or weight of the child in the seat assembly 30.

The embodiments of the present invention described above do not represent the only suitable configurations of the present invention. In particular, other configurations of the bouncer control device 40 may be implemented in the children's bouncer apparatus 10 according to various embodiments. For example, according to certain embodiments, the first magnetic component and second magnetic component are configured to generate an attractive magnetic force. In other embodiments, the first magnetic component and second magnetic component are configured to generate a repulsive magnetic force.

According to various embodiments, the mobile member 424 of the magnetic drive assembly 420 may be configured to rotate upward or downward in response to both an attractive or repulsive magnetic force. In one embodiment the drive component of the magnet drive assembly 420 is configured such that the reciprocating device is positioned above the mobile member 424. Accordingly, in certain embodiments where the magnetic force generated by the first and second magnetic components causes the mobile member 424 to rotate downward, the reciprocating device positioned above the mobile member 424 is a tension spring. In other embodiments, where the magnetic force generated by the first and second magnetic components causes the mobile member 424 to rotate upward, the reciprocating device is a compression spring.

In addition, according to certain embodiments, the first magnetic component and second magnetic components are mounted on the base portion 210 of the support frame 20 and a bottom front edge of the seat assembly 30 or support arms 220. Such embodiments would not require the drive component of the bouncer control device 40, as the magnetic force generated by the magnetic components would act directly on the support frame 20 and seat assembly 30. As will be appreciated by those of skill in the art, the algorithm controlling the bouncer control circuit 440 may be adjusted to accommodate these various embodiments accordingly.

Furthermore, various embodiments of the bouncer control device 40 may be configured to impart a gentle, repetitive pulse force to the bouncer apparatus 10 that can be felt by a child positioned in the seat assembly 30. The pulse force may be repeated at a frequency equivalent to that of a human heartbeat in order to provide a soothing heartbeat sensation to the child positioned in the seat assembly 30.

For example, in certain embodiments, the bouncer control circuit 440 is configured to trigger electrical pulses to the electromagnetic coil 422 that cause the magnetic drive assembly's mobile member 424 to move upwards and strike an upper surface of the housing 410, thereby imparting a gentle pulse force to the housing 410 than can be felt in the seat assembly 30. In one embodiment, the control circuit 440 is configured to generate the above-described pulse force by first triggering a first short pulse of electrical current to the electromagnetic coil 422 (e.g., a pulse having a duration of between 10 and 100 milliseconds with an average magnitude of about 22 milliamps). This initial short pulse generates an attractive magnetic force between the 422 and permanent magnet 421 and causes the drive assembly's mobile member 424 to rotate downward and compress the spring 429.

Next, the bouncer control circuit 440 allows for a short delay (e.g., between 1 and 100 milliseconds) in which no electrical current is supplied to the coil 422. During this delay period, the spring 429 decompresses and pushes the mobile member 424 upwards. Next, the bouncer control circuit 440 triggers a second short pulse of electrical current to the electromagnetic coil 422. The second pulse may be slightly longer than the first pulse (e.g., a pulse having a duration of between 20 and 200 milliseconds with an average magnitude of about 22 milliamps) and the direction of the second pulses' current is reversed from that of the first pulse. As such, the second short pulse generates a repulsive magnetic force between the coil 422 and permanent magnet 421 and causes the drive assembly's mobile member 424 to rotate upwards and strike an upper surface of the housing 421. The impact of the mobile member 424 on the housing 421 results in a gentle pulse force that can be felt by a child in the seat assembly 30.

According to various embodiments, the bouncer control circuit 440 is configured to repeat the above-described steps at a particular frequency in order to generate repetitive, gentle pulse forces in the seat assembly 30. In certain embodiments, the bouncer control circuit 440 to configured to repeatedly generate the gentle pulse force in the seat assembly 30 at a constant frequency between 60 and 100 pulses per minute (e.g., between 1.00 and 1.67 Hz). By generating repetitive gentle pulse forces in the seat assembly 30 at a frequency within this range, a child positioned in the seat assembly 30 feels a pulsing sensation that mimics the heartbeat of a parent. In certain embodiments, the bouncer control circuit 440 settings may be adjusted (e.g., via one or more user controls) such that the frequency of the pulsing sensation matches the resting heartbeat of a parent-user.

According to various embodiments, the magnitude of the pulse forces transmitted through the seat assembly 30 may be adjusted by increasing or decreasing the magnitude of the electrical pulses transmitted to the coil 422. In addition, in certain embodiments, damping pads can be positioned on the impact portion upper surface of the housing 421 in order to damp the pulsing sensation felt by a child in the seat assembly 30.

In certain embodiments, the bouncer control device 40 may be configured with multiple control modes such that the device 40 can provide both the above-described natural frequency bouncer motion control and the above-described heartbeat sensation effect. However, in other embodiments, the device 40 may be configured specifically to perform one function or the other. For example, in certain embodiments, the device 40 is specifically configured to impart the above-described heartbeat pulses. In such embodiments, the device 40 may be reconfigured such that the mobile member 424 can be driven to impact the housing 421 in response to a single electrical pulse (e.g., where the height of the housing is reduced, thereby reducing the angle through which the mobile member 424 must travel to impact the housing 421). Accordingly, the bouncer control circuit 440 may be reconfigured according to particular configurations of the device 40 in order to cause the drive assembly 420 to impart gentle, repetitive force pulses to the seat assembly 30. Furthermore, various embodiments of the bouncer control device 40 may be configured to be attached to, or integrated within, other infant support devices (e.g., car seats, strollers) in order to provide the above-described heartbeat sensation in such support devices.

CONCLUSION

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A motion sensing apparatus for a moving child support device, said motion sensing apparatus comprising:
   a housing defining a longitudinal axis;
   at least one piezoelectric sensor having a sensing surface positioned within the housing;
   a weighted member positioned within the housing and configured for movement in the direction of the housing's longitudinal axis; and
   a signal amplifier;
   wherein the weighted member is configured to apply a variable force to the sensing surface of the piezoelectric sensor in response to movement of the motion sensing apparatus;
   wherein the piezoelectric sensor is configured to output a voltage signal corresponding to the magnitude of the variable force applied by the weighted member, the output voltage signal being indicative of the motion sensing apparatus's movement with respect to the housing's longitudinal axis; and
   wherein the signal amplifier is configured to receive the voltage signal output by the piezoelectric sensor and filter the voltage signal in order to output a motion signal indicative of the frequency of the motion sensing apparatus's oscillation with respect to the housing's longitudinal axis.

2. The motion sensing apparatus of claim 1, wherein the motion signal output by the signal amplifier comprises:
   a first voltage level indicating that the motion sensing apparatus is accelerating in an upward direction or decelerating in a downward direction, and
   a second voltage level indicating that the motion sensing apparatus is decelerating in an upward direction or accelerating in a downward direction, the second voltage level being different from the first voltage level.

3. The motion sensing apparatus of claim 1, wherein the sensing surface of the piezoelectric sensor is positioned proximate an end of the housing; and wherein, when the motion sensing apparatus is oriented generally vertically with respect to gravity such that the sensing surface is at a lower end of the housing:
   the weighted member is configured to rest on the sensing surface and apply a constant, resting compressive force to the sensing surface when the motion sensing apparatus is at rest; the weighted member is configured to apply a compressive force having a magnitude greater than the resting compressive force when the motion sensing apparatus is accelerated while moving upward and when the motion sensing apparatus is decelerated while moving downward; and the weighted member is configured to apply a compressive force having a magnitude less than the resting compressive force, or no compressive force, when the motion sensing apparatus is accelerated while moving downward and when the motion sensing apparatus is decelerated while moving upward.

4. The motion sensing apparatus of claim 1, wherein the weighted member comprises a weighted ball.

5. The motion sensing apparatus of claim 1, wherein the housing comprises a hollow cylinder.

6. The motion sensing apparatus of claim 1, wherein the sensing surface of the piezoelectric sensor is oriented perpendicular to the longitudinal axis of the housing.

7. A bouncer control device for controlling the generally upward and downward motion of a children's bouncer, the bouncer control device comprising:
   a drive assembly configured to be actuated in order to impart a motive force on the children's bouncer that causes the children's bouncer to bounce, wherein the drive assembly is actuated by electric current;
   a power supply configured to transmit electric current to the drive assembly;
   a piezoelectric motion sensor configured to sense the natural frequency of the children's bouncer and generate a frequency signal representative of the natural frequency, wherein the piezoelectric motion sensor comprises:
      a housing defining a longitudinal axis;
      at least one piezoelectric sensor including a sensing surface positioned within the housing; and
      a weighted member positioned within the housing and configured for movement within the housing in the direction of the housing's longitudinal axis, wherein the weighted member is configured to apply a variable force to the sensing surface of the piezoelectric sensor in response to movement of the children's bouncer, and wherein the frequency signal output by the piezoelectric sensor corresponds to the magnitude of the variable force applied by the weighted member; and
   a bouncer control circuit configured to:
      receive the frequency signal from the piezoelectric motion sensor; and generate a control signal, based at least in part on the received frequency signal, that triggers the power supply to intermittently supply electric current to the drive assembly and thereby cause the drive assembly to impart a motive force on the children's bouncer that causes the bouncer to bounce at a frequency substantially equal to the natural frequency.

8. The bouncer control device of claim 7, wherein the motion sensor's housing is configured such that the longitudinal axis of its housing is oriented vertically with respect to the bouncer control device; and wherein the sensing surface of the piezoelectric sensor is oriented substantially perpendicular to the longitudinal axis of the housing and is positioned proximate a lower end of the housing.

9. The bouncer control device of claim 7, wherein the weighted member comprises a weighted ball.

10. The bouncer control device of claim 7, wherein the housing comprises a hollow cylinder.

11. The bouncer control device of claim 7, wherein the drive assembly comprises an electromagnetic drive assembly.

12. The bouncer control device of claim 7, further comprising a control device housing configured to be removably affixed to said children's bouncer, wherein the drive assembly, piezoelectric motion sensor, and control circuit are housed within the control device housing.

13. A control device for an infant support configured for providing a soothing sensation for a child positioned in the infant support, the control device comprising:
- a drive assembly configured to, in a first control mode, impart repetitive pulse forces to the infant support with a magnitude sufficient for the pulses to be felt by a child positioned in the infant support and, in a second control mode, impart a motive force to the infant support in order to cause the infant support to bounce; and
- a control circuit configured to receive user input selecting the first control mode or the second control mode, wherein the control circuit is configured to, in response to user selection of the first control mode, actuate the drive assembly and cause the drive assembly to impart the repetitive pulse forces on the infant support at a frequency analogous to the frequency of a resting human heartbeat, and wherein the control circuit is configured to, in response to user selection of the second control mode, actuate the drive assembly and cause the drive assembly to impart the motive force to the infant support to cause the infant support to bounce.

14. The control device of claim 13, wherein, in the first control mode, the control circuit is configured to actuate the drive assembly to impart the repetitive pulse forces at a frequency between 60 and 100 pulses per minute.

15. The control device of claim 13, wherein the drive assembly comprises:
- a housing configured to be affixed to the infant support;
- a mobile member positioned within the housing and configured to be actuated in the first control mode such that it impacts a portion of the housing and imparts a pulse force to the housing.

16. The control device of claim 15, wherein the drive assembly further comprises an electromagnet configured to drive the mobile member in response to receiving a pulse of electric current;
   wherein, in the first control mode, the control device is configured to generate a control signal causing a power supply to intermittently supply electric current to the electromagnet and thereby cause the mobile member to impact the housing at a frequency between 60 and 100 times per minute.

17. The control device of claim 13, wherein the control device is configured to be removably secured to an infant support.

* * * * *